United States Patent
Ohshima et al.

(10) Patent No.: US 7,388,445 B2
(45) Date of Patent: Jun. 17, 2008

(54) PIEZOELECTRIC OSCILLATOR FOR QUADRATURE MODULATION

(75) Inventors: Tsuyoshi Ohshima, Kouza-gun (JP); Toshiyasu Takasugi, Kouza-gun (JP); Masahiro Onuki, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 311 days.

(21) Appl. No.: 11/068,679

(22) Filed: Mar. 1, 2005

(65) Prior Publication Data

US 2005/0195043 A1    Sep. 8, 2005

(30) Foreign Application Priority Data

Mar. 2, 2004    (JP) .............................. 2004-056967

(51) Int. Cl.
*H03B 5/32*    (2006.01)

(52) U.S. Cl. ............ 331/158; 331/116 R; 331/116 FE; 331/45

(58) Field of Classification Search .............. 331/158, 331/116 R, 116 FE, 45

See application file for complete search history.

(56) References Cited

U.S. PATENT DOCUMENTS 7,088,188 B2 *    8/2006    Fredriksson ................. 331/46

FOREIGN PATENT DOCUMENTS

| JP | 08-223233 | 8/1996 |
| JP | 2001-217886 | 8/2001 |

* cited by examiner

*Primary Examiner*—Arnold Kinkead
(74) *Attorney, Agent, or Firm*—William L. Androlia; H. Henry Koda

(57) ABSTRACT

A quartz oscillator for quadrature modulation has a quartz oscillating circuit including a transistor, a quartz oscillator, a capacitor, and a resistor, a double-mode quartz filter, a reactance element, and an amplifier. The quartz oscillator is constituted so that an output of the quartz oscillating circuit is a first output, and its output is connected to one terminal of the double-mode quartz filter where a common electrode is grounded. The reactance element is connected in parallel between the other terminal and the ground, and a second output is obtained from a connected point via the amplifier.

7 Claims, 4 Drawing Sheets

PRIOR ART

PIEZOELECTRIC OSCILLATOR FOR QUADRATURE MODULATION

BACKGROUND OF THE INVENTION

1. Field of the Invention

The present invention relates to an oscillator for quadrature modulation to be used in digital communication. The invention particularly relates to a piezoelectric oscillator for quadrature modulation in which consumption current is reduced.

2. Description of the Related Art

Recently, high-speed high-capacitance systems that transmit/receive large amounts of information at high speed are the primary systems as mobile communication systems. In such mobile communications, QPSK and QAM which are suitable for high-speed communications are widely used as modulation schemes since usability of frequencies is high. The QPSK or the QAM modulating circuits of mobile telephones use a quadrature modulation scheme of multiplying carrier waves having phase difference of 90 degrees by modulating signals, respectively. The quadrature modulation scheme is disclosed in detail in Japanese Patent Laid-Open Nos. 08-223233, and 2001-217886.

FIG. 7 is a block diagram showing a configuration of a 90 degree phase shifter disclosed in Japanese Patent Laid-Open No. 2001-217886. The 90 degree phase shifter includes an oscillator 21 that generates a local signal $L_o$, a phase shifter 22 that generates two local phase shifting signals $L_o I'$ and $L_o Q'$ having phase difference from the local signal $L_o$, an oscillator 23 that generates a clock signal CLK having a frequency twice as high as those of the local phase shifting signals $L_o I'$ and $L_o Q'$, a D flip-flop 24 that inputs the local phase shifting signal $L_o Q'$ and the clock signal CLK, and outputs a quadrature component $L_o Q$ of the 90 degree phase shifting signal, and a D flip-flop 25 that inputs the local phase shifting signal $L_o I'$ and an inverted clock signal $\overline{CLK}$, and outputs a phase component $L_o I$ which is the same as that of the 90 degree phase shifting signal.

The local signal $L_o$ output from the oscillator 21 is input into the phase shifter 22, and the phase shifter 22 outputs the two local phase shifting signals $L_o I'$ and $L_o Q'$ whose phases are different. Since the local phase shifting signals $L_o I'$ and $L_o Q'$ include a phase shift error, their phase difference is not 90 degrees. The local phase shifting signals $L_o I'$ and $L_o Q'$ are input into the D flip-flops 24 and 25, respectively.

A clock signal CLK having a frequency which is twice as high as the frequency $f1'$ of the local phase shifting signals $L_o I'$ and $L_o Q'$ ($f_{CLK}=2 \times f1'$) is input into the D flip-flop 24, and an inverted clock signal $\overline{CLK}$ is input into the D flip-flop 25. The local phase shifting signal $L_o Q'$ input into the D flip-flop 24 is shaped at a rise time of the clock signal, so as to be output as a phase shifting signal $L_o Q$. On the other hand, the local phase shifting signal $L_o I'$ input into the D flip-flop 25 is shaped at a fall time of the clock signal because the inverted clock signal is used, so as to be output as a phase shifting signal $L_o I$.

As a result, the phase shifting signals $L_o Q$ and $L_o I$ are synchronized with each other as signals having a phase difference of ½ period of the clock signal CLK (¼ period of the phase shifting signal), namely, signals having a phase difference of 90 degrees with respect to each other so as to be output. FIGS. 8a to 8e are timing charts of respective sections of the 90 degree phase shifter shown in FIG. 7. FIG. 8a shows the clock signal CLK, FIG. 8b shows the local phase shifting signal $L_o I'$ as the same phase component as the local signal $L_o$, FIG. 8c shows the local phase shifting signal $L_o Q'$ as the quadrature component of the local signal $L_o$, FIG. 8d shows the same phase component $L_o I$ as the 90 degree phase shifter, and FIG. 8e shows the quadrature component $L_o Q$ of the 90 degree phase shifter.

In order to obtain a quadrature output, however, the conventional phase shifter uses the oscillator that generates a clock signal having a frequency twice as high as that of a local signal and the two D flip-flops so as to generate two local signals (carrier waves) with phase difference of 90 degrees. For example, when a local signal (carrier wave) of 100 MHz is to be obtained from the 90 degree phase shifter, an oscillating circuit for a clock signal of 200 MHz is required. In order to maintain oscillation in the high-frequency oscillating circuit, negative resistance of predetermined level has to be generated, thereby requiring large electric current. Furthermore, the electric current cannot be reduced, because consumption current of a dividing circuit is added.

SUMMARY OF THE INVENTION

In order to solve the above problems, the present invention provides a piezoelectric oscillator for quadrature modulation including: a piezoelectric oscillating circuit having a transistor, a piezoelectric oscillator, a capacitance, and a resistor; a double-mode quartz filter; a reactance element; and an amplifier. An output of the piezoelectric oscillating circuit is a first output, the output is connected to one terminal of the double-mode quartz filter in which a common electrode is grounded, and the reactance element is connected in parallel between the other terminal and the ground. A second output is obtained from a connected point via the amplifier.

DETAILED DESCRIPTION OF THE PREFERRED EMBODIMENTS

Figure 1:
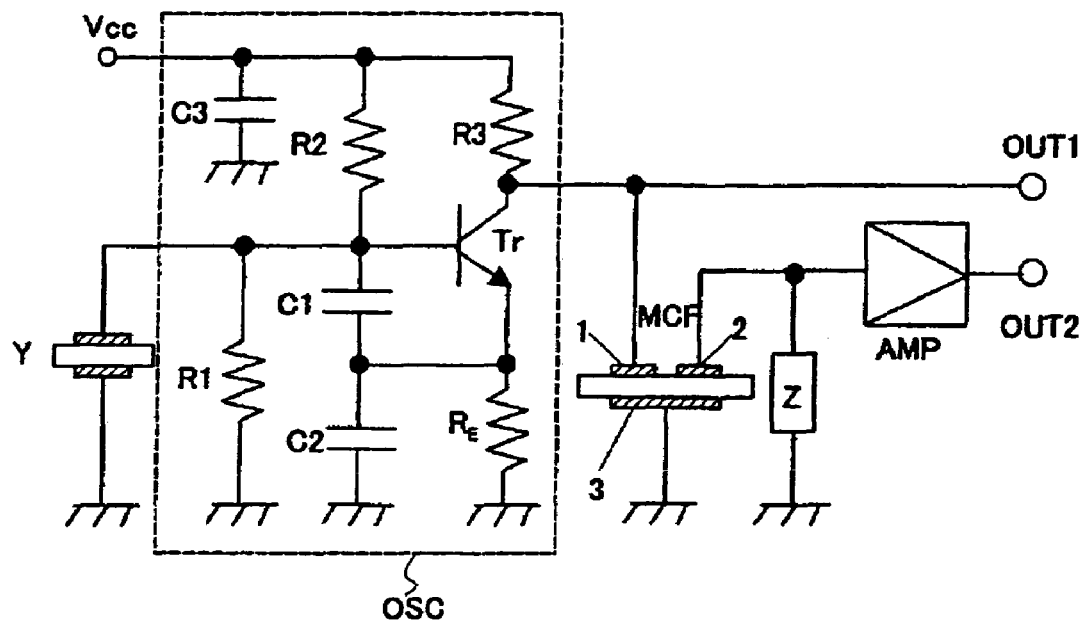
FIG. 1 is a circuit diagram showing a configuration of an oscillator for quadrature modulation according to the present invention.

FIG. 1 is a schematic circuit diagram showing a configuration of a quartz oscillator for quadrature modulation according to one embodiment of the present invention. The quartz oscillator for quadrature modulation has a quartz oscillator Y, a Colpitts oscillating circuit OSC including a transistor Tr, capacitors C1, C2, and C3, and resistors $R_E$, R1, R2, and R3, a double-mode monolithic quartz filter MCF (hereinafter, MCF), a reactance element Z, and an amplifier AMP.

One terminal of the quartz oscillator Y is connected to a base of the transistor Tr in the Colpitts oscillating circuit OSC, and the other terminal is grounded. A collector of the transistor Tr in the Colpitts oscillating circuit OSC is connected to a first output terminal OUT1. The collector of the transistor Tr is connected to one electrode 1 of the MCF, and the reactance element Z is connected between another electrode 2 and the ground in parallel. The electrode 2 of the MCF is connected to an input of the amplifier AMP, and an output of the amplifier AMP is connected to a second output terminal OUT2, so as to configure the quartz oscillator for quadrature modulation. Since the MCF is operated as a band-pass filter, an electrode 3 (common electrode) is grounded.

The MCF element used herein is constituted such that the two electrodes 1 and 2 are arranged adjacently on one surface of an AT cut quartz substrate, and the electrode 3 (common electrode) which is opposed to the electrodes 1 and 2 is provided on the other surface.

As publicly known, the Colpitts oscillating circuit is constituted such that an inductive element is connected between the collector and the base of the transistor, and a capacitive element is connected between the base and an emitter and between the collector and the emitter. The quartz oscillator Y is used as the inductive element between the collector and the base of the transistor Tr, and the quartz oscillator Y is arranged between the base and the ground of the transistor Tr. A circuit for connecting the capacitors C1 and C2 in series is connected between the base and the ground of the transistor Tr, and the resistor $R_E$ is connected between the emitter and the ground of the transistor Tr. A midpoint of the circuit for connecting the capacitors C1 and C2 in series is connected to the emitter of the transistor Tr.

Since a power source Vcc and the ground are short-circuited by a bypass capacitor C3 at the higher frequencies in the Colpitts oscillating circuit, the inductive element as the quartz oscillator Y is inserted between the collector and the base of the transistor Tr so that an equivalent circuit is constituted. Since the midpoint of the circuit for connecting the capacitors C1 and C2 in series is connected to the emitter of the transistor Tr, the capacitor C1 is inserted between the base and the emitter of the transistor Tr, and the capacitor C2 is inserted between the collector and the emitter of the transistor Tr. The capacitors C1 and C2 in the oscillating circuit function as the capacitive elements. The resistors R1 and R2 are bleeder resistors, and set a base bias voltage of the transistor Tr.

In the Colpitts quartz oscillating circuit, it is known that an amplification degree on the circuit side from both ends of the quartz oscillator Y, namely, a so-called negative resistor $R(\Omega)$ is inversely proportional to the capacitors C1 and C2 and a square $\omega^2$ of the frequency but is proportional to collector current. That is, as the frequency becomes higher, an absolute value of the negative resistor $R(\Omega)$ increases and reaches a peak value at a predetermined frequency. As, thereafter, the frequency becomes higher, the absolute value decreases. In a normal Colpitts quartz oscillator, the negative resistor R at oscillating frequency is generally set to a value which is about five times as large as an equivalent resistor of the quartz oscillator Y.

Figure 2:
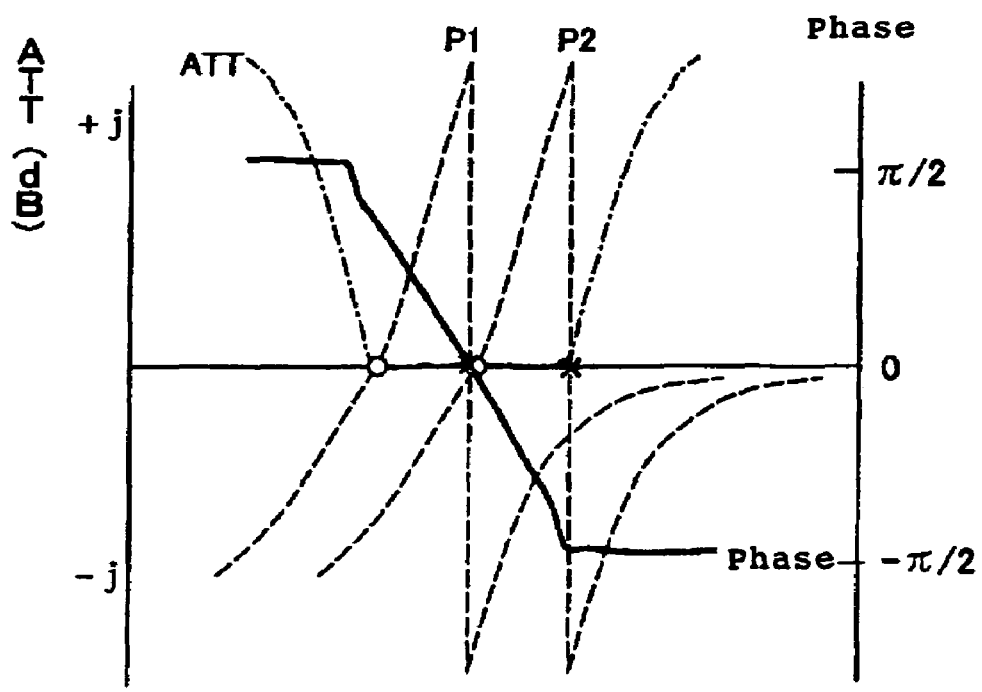
FIG. 2 is a diagram showing reactance curves, filter characteristics, and phase characteristics of a double-mode quartz filter.

As publicly known, in order to configure the band-pass filter using the MCF element, the equivalent circuit of the MCF element is considered as a lattice circuit. When an image parameter is examined, as shown by broken lines in FIG. 2, an antiresonant frequency (x) of a reactance curve P1 drawn by a lattice arm of the lattice circuit is brought close to a resonant frequency (o) of a reactance curve P2 drawn by a series arm of the lattice circuit, and the lattice circuit is terminated at suitable impedance so that the band-pass filter can be constituted. A range from the resonant frequency (o) of the reactance curve P1 to the antiresonant frequency (x) of the reactance curve P2 is a pass band as shown by an alternate long and short dash line in FIG. 2, and the other range is an attenuation band. The phase characteristics change approximately linearly from $\pi/2$ to $-\pi/2$ in the pass band with respect to a center frequency of 0 as shown by a thick line in FIG. 2.

Figure 3:
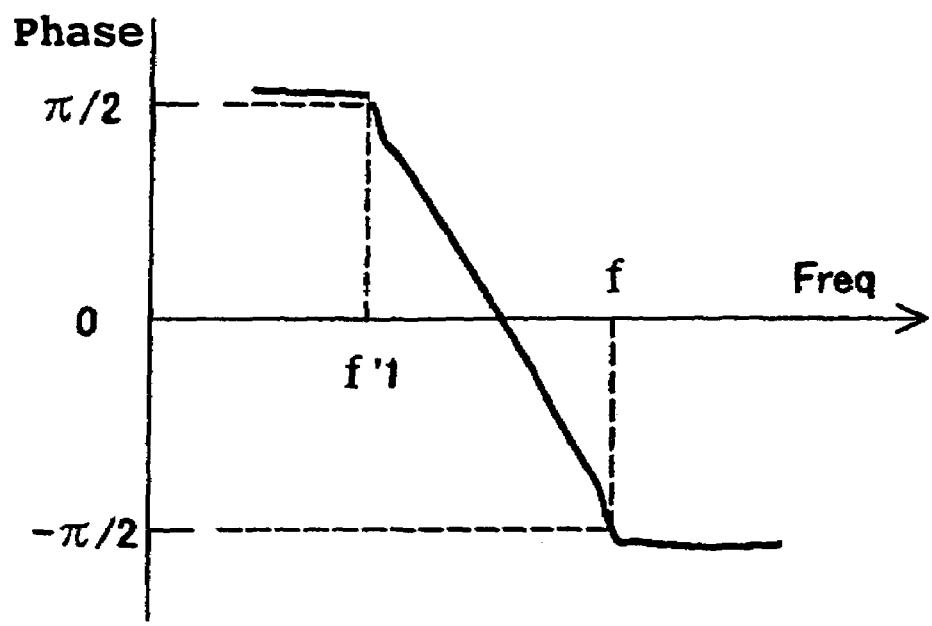
FIG. 3 is a diagram showing a relationship between a frequency and the phase characteristics of the double-mode quartz filter.

The operating principle of the present invention is explained based on the above knowledge. The MCF is set such that an output frequency F1 obtained from the output terminal of the Colpitts quartz oscillator is positioned near a cutoff on the side of high-pass band of the MCF element. As described above, the relationship between the phase characteristics and the frequency of the MCF is as shown in FIG. 3 (extraction of the thick line in FIG. 2), and the phase shifts by $\pi/2$ (90 degrees) at a frequency f near the cutoff on the side of the high-pass band in comparison with the center frequency (phase 0). That is, the phase characteristics of the MCF are set so that the phase transition of the MCF becomes $\pi/2$ (90 degrees) at the frequency F1 of the output from the oscillator, namely, f=F1. The input electrode 1 of the MCF is excited by the frequency F1, and the phase of the output signal from the output electrode 2 in the MCF shifts 90 degrees due to the phase characteristics of the MCF. The output signal from the oscillator and the output signal from the MCF, therefore, have the same frequency, but their phases are different from each other by 90 degrees. The quartz oscillator for quadrature modulation can be, therefore, realized, by utilizing the phase characteristics of the MCF.

Similarly, even when a frequency f' of the MCF near the cutoff on the side of the low-pass band is set to the output frequency F1 of the oscillator, the phase transition of $\pi/2$ (90 degrees) can be given to the MCF, thereby realizing the quartz oscillator for quadrature modulation.

The circuit serves as the oscillator for quadrature modulation based on the aforementioned principle, but when a quadrature modulator-demodulator is constituted based on the principle, next circuits which are connected to the output terminals, respectively, serve as loads.

At this time, when the load is connected directly to the output terminal of the MCF, the phase characteristic of the MCF changes according to the value of the load, and thus the phase difference with respect to the signal to be supplied to the input electrode occasionally shifts from 90 degrees.

Accordingly, as shown in FIG. 1, actually, the predetermined reactance element Z is inserted between the output electrode and the ground of the MCF, so that the phase of the signal output from the output electrode is kept different by 90 degrees from the signal to be supplied to the input electrode regardless of the load of the next circuit. Accordingly, in the circuit shown in FIG. 1, the output terminal of the Colpitts oscillating circuit OSC is the first output terminal OUT1, and a connected point between the output electrode 2 of the MCF and the reactance element Z is the second output terminal OUT2. If necessary, the reactance element Z is varied, so that the phase transition may be finely adjusted to 90 degrees accurately.

Since the level of the output signal from the MCF tends to become lower than that of the output OUT1 from the oscillator, it is desirable that the balance of the levels is adjusted by inserting the amplifier AMP between the connected point between the output electrode 2 of the MCF and the reactance element Z, and the second output terminal OUT2.

Figure 4:
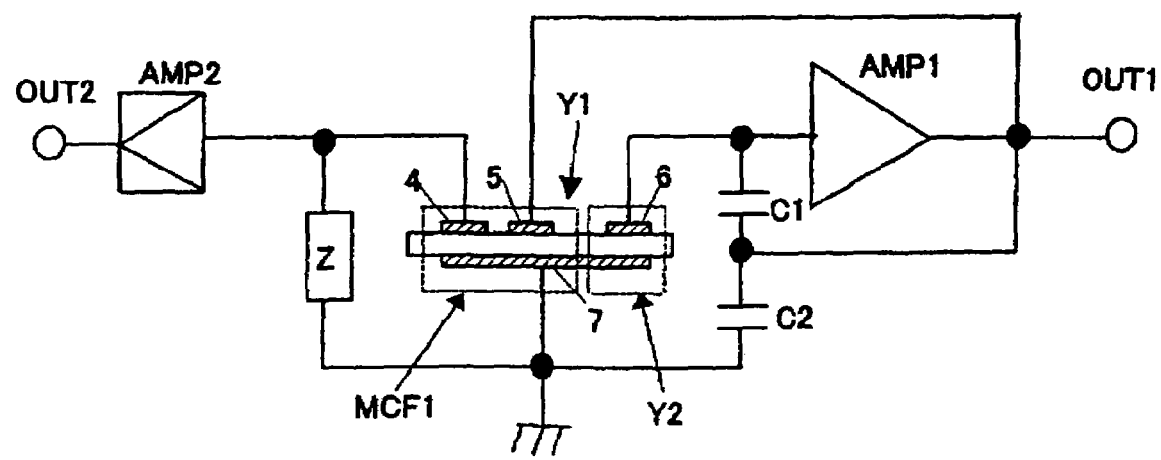
FIG. 4 is a block diagram showing a configuration of an oscillator for quadrature modulation according to a second embodiment.

FIG. 4 is a schematic block diagram showing a configuration of a quartz oscillator for quadrature modulation according to a second embodiment of the present invention. In this embodiment, a first electrode 4 and a second electrode 5 are arranged on one surface of an AT cut quartz substrate so as to be close to each other, and a third electrode 6 is arranged with a gap such that it is not acoustically coupled with the two electrodes 4 and 5. A fourth electrode 7 is provided on the other surface of the AT cut quartz substrate so as to be opposed to the first, the second, and the third electrodes 4, 5, and 6. The quarts oscillator for quadrature modulation has a coupling oscillator Y1 constituted in the above manner, a first amplifier AMP1, a second amplifier AMP2, a reactance element Z, and capacitors C1 and C2. The fourth electrode 7 of the coupling oscillator Y1 is grounded. The third electrode 6 of the coupling oscillator Y1 is connected to an input terminal of the first amplifier AMP1, and a circuit in which the two capacitors C1 and C2 are connected in series is connected between an input terminal and a ground of the first amplifier AMP1. An output terminal of the first amplifier AMP1 is connected to the first output terminal OUT1, and the output terminal of the first amplifier AMP1 is connected to a midpoint between the series-connected capacitors C1 and C2. The output terminal of the first amplifier AMP1 is connected to the second electrode 5 of the coupling oscillator Y1. The reactance element Z is connected between the first electrode 4 and the ground, and the first electrode 4 is connected to an input terminal of the second amplifier AMP2. An output terminal of the second amplifier AMP2 is connected to the second output terminal OUT2, so that the quartz oscillator for quadrature modulation is constituted.

Since the third electrode 6 of the coupling oscillator Y1 is arranged with such a gap that it is not acoustically coupled with the first and the second electrodes 4 and 5, the third electrode 6 and the fourth electrode 7 form a quartz oscillator Y2. On the other hand, since the first and the second electrodes 4 and 5 are arranged so as to be close to each other, the first electrode 4, the second electrode 5, and the fourth electrode 7 opposed to the electrodes 4 and 5 form the MCF1.

An operation of the oscillator for quadrature modulation shown in FIG. 4 is explained. The quartz oscillator Y2 formed by the third electrode 6 and the fourth electrode 7, the first amplifier AMP1, and the capacitors C1 and C2 configure the quartz oscillating circuit, and the first output frequency F1 is output from the first output terminal OUT1. Since this output is supplied to the second electrode 5 of the MCF1 formed by the first, the second, and the fourth electrodes 4, 5, and 7, the MCF1 is excited by the frequency F1. The phase shifts by $\pi/2$ (90 degrees) at the frequency f of the MCF1 near the cutoff on the side of the high-pass band in comparison with the center frequency. The phase characteristics of the MCF1 are set so that the phase transition of the MCF1 becomes $\pi/2$ (90 degrees) at the frequency F1 of the output from the oscillator. The input electrode 5 of the MCF1 is excited by the frequency F1, and phase of an output signal F2 obtained from the output electrode 4 of the MCF shifts by 90 degrees due to the phase characteristics of the MCF1. Although the output signal F1 from the oscillator and the output signal F2 from the MCF1 have, therefore, the same frequency, their phases are different from each other by 90 degrees.

The phase difference between the two frequencies F1 and F2 can be adjusted by the value of the reactance element Z.

Figure 5:
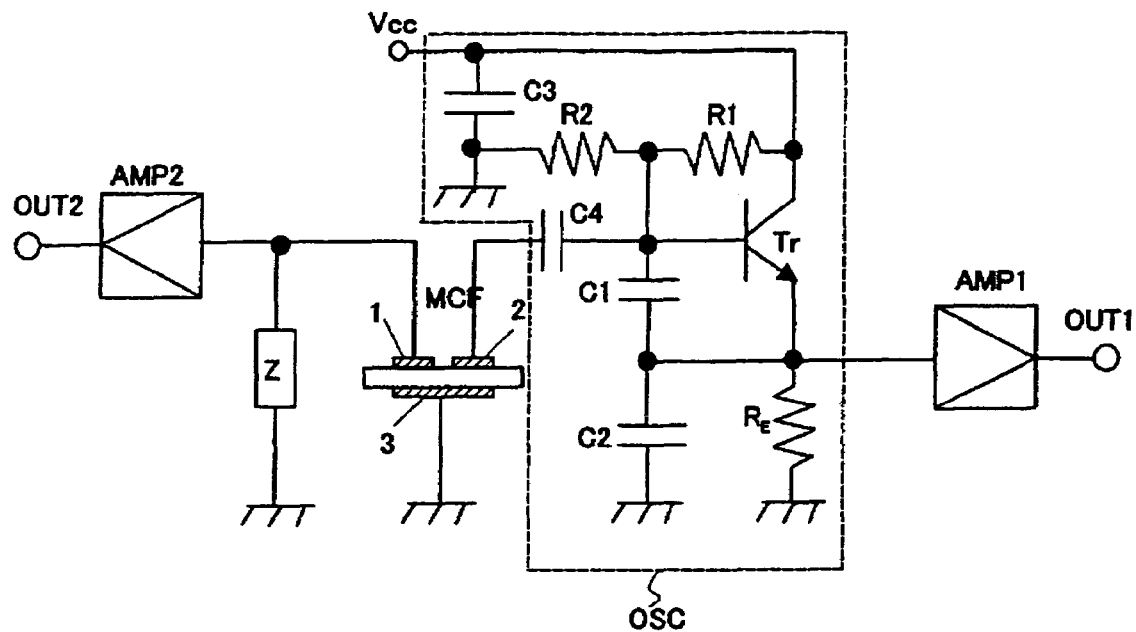
FIG. 5 is a circuit diagram showing a configuration of an oscillator for quadrature modulation according to a third embodiment.

FIG. 5 is a schematic block diagram showing a configuration of a quartz oscillator for quadrature modulation according to a third embodiment. The quartz oscillator has the Colpitts oscillating circuit which includes the transistor Tr, the capacitors C1, C2, C3, and C4, the resistors $R_E$, R1, and R2, the MCF, the first amplifier AMP1, the second amplifier AMP2, and the reactance element Z.

The common electrode 3 of the MCF is grounded, and the electrode 2 of the MCF is connected to a base of the transistor Tr in the Colpitts oscillating circuit via the capacitor C4. A resonating circuit including the electrode 2 and the common electrode 3 of the MCF, and the Colpitts oscillating circuit OSC form the quartz oscillating circuit. The output from the Colpitts oscillating circuit OSC is taken out from both terminals of the resistor $R_E$ connected between the emitter and the ground of the transistor Tr, and this output is supplied to an input terminal of the first amplifier AMP1. An output terminal of the first amplifier AMP1 is connected to the first output terminal OUT1.

The electrode 1 of the MCF is connected to an input terminal of the second amplifier AMP2, and the reactance element Z is connected between the input terminal and the ground. An output terminal of the second amplifier AMP2 is connected to the second output terminal OUT2, so that the quartz oscillator for quadrature modulation is constituted.

The quartz resonating circuit formed by the electrodes 2 and 3 of the MCF and the Colpitts oscillating circuit OSC form the Colpitts quartz oscillating circuit, and the output frequency F1 is output from the first output terminal OUT1. At the same time, the MCF is also driven by the frequency F1. The phase shifts by $\pi/2$ (90 degrees) at the frequency f of MCF near the cutoff on the side of the high-pass band in comparison with the center frequency. The phase characteristics of the MCF are set so that the phase transition of the MCF becomes $\pi/2$ (90 degrees) at the frequency F1 of the output from the oscillator. The input electrode 2 of the MCF is excited by the frequency F1, and the phase of the output signal F2 obtained from the output electrode 1 of the MCF shifts by 90 degrees due to the phase characteristics of the MCF. The output signal F1 from the oscillator and the output signal F2 from the MCF, therefore, have the same frequency, but their phases are different from each other by 90 degrees.

The phase difference between the output signals F1 and F2 can be adjusted by the value of the reactance element Z.

Figure 6:
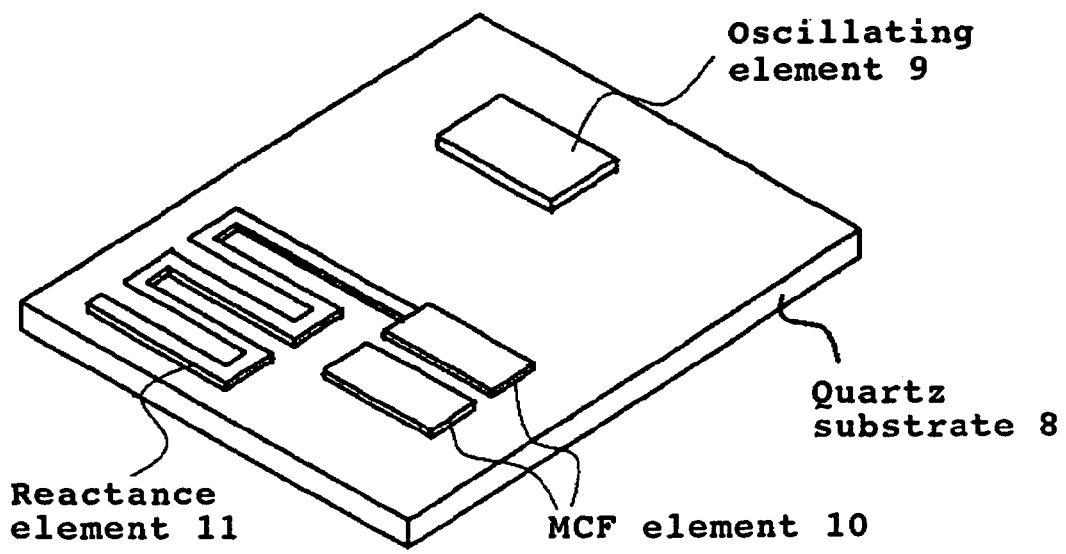
FIG. 6 is a perspective view in which a quartz oscillating element, an MCF element, and a reactance element are constituted on one quarts substrate according to a fourth embodiment.
Figure 7:
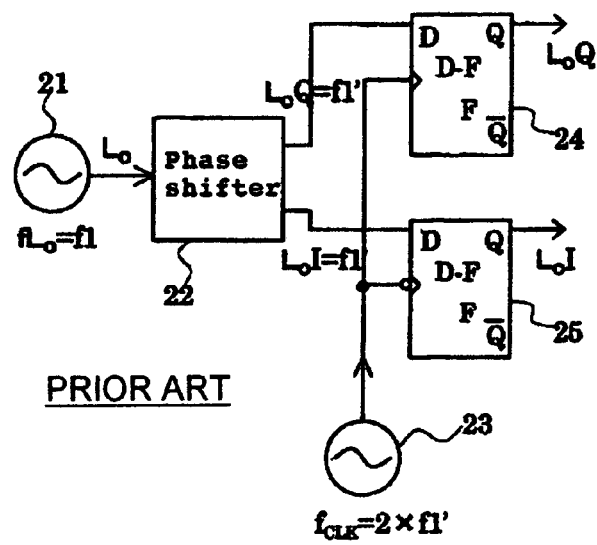
FIG. 7 is a block diagram showing a configuration of a conventional quadrature modulating device.
Figure 8:
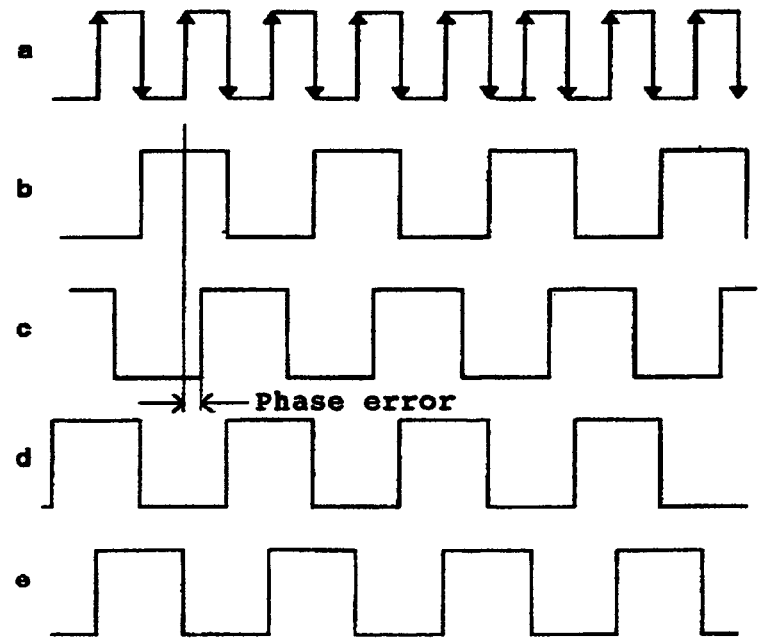
FIGS. 8a to 8e are timing charts of respective sections of a 90 degree phase shifter shown in FIG. 7.

FIG. 6 is a perspective view in which a quartz oscillating element 9, an MCF element 10, and a reactance element 11 are formed on a quartz substrate 8 according to a fourth embodiment. An oscillating circuit, an amplifier, and the like are added, so that the quartz oscillator for quadrature modulation can be miniaturized. Further, IC-compatible oscillating circuit, amplifying circuit, and the like are mounted on the quartz substrate 8 on which the quartz oscillating element 9, the MCF element 10, and the reactance element 11 are formed, and the quartz substrate 8 is housed in a package, so that the quartz oscillator for quadrature modulation is constituted. As a result, the quartz oscillator can be further miniaturized.

In the above explanation about the quartz oscillator for quadrature modulation, the Colpitts oscillating circuit is taken as an example, but the present invention is not limited to the Colpitts oscillating circuit, and thus a Pierce oscillating circuit, a Hartley oscillating circuit, or the like may be used.

The two-pole double-mode quartz filter is used and the quartz oscillator for quadrature modulation using its phase characteristics is explained in the above embodiments. However, obviously, the quartz oscillator for quadrature modulation can be constituted by using a double-mode quarts filter with two or more poles.

Furthermore, it is easily understood that the oscillator for quadrature modulation can be constituted by using the phase characteristics of a surface acoustic wave filter instead of the double-mode quartz filter.

Since the piezoelectric oscillator for quadrature modulation according to the present invention does not require doubled frequency or a flip-flop circuit, consumption current of the oscillating circuit can be reduced, and the quartz oscillator can be miniaturized.

What is claimed is:

1. An oscillator for quadrature modulation, comprising:
a piezoelectric oscillating circuit in which a piezoelectric oscillator is a frequency determining element; and
a monolithic piezoelectric filter generating a phase difference between an input signal and an output signal, and at least one of the piezoelectric oscillator and the monolithic piezoelectric filter uses AT cut quartz; and
an output signal from the piezoelectric oscillating circuit is inputted to an input terminal of the monolithic piezoelectric filter, an output signal from the piezoelectric oscillating circuit is a first output, and the output signal from an output terminal of the monolithic piezoelectric filter is a second output.

2. An oscillator for quadrature modulation, comprising:
a coupling oscillating element, in which an electrode configuring the monolithic piezoelectric filter and an electrode configuring the piezoelectric oscillator are arranged on one piezoelectric substrate so as not to be acoustically coupled with each other, and a piezoelectric oscillating circuit in which the piezoelectric oscillator is a frequency determining element; and the monolithic crystal filter generating a phase difference between an input signal and an output signal; and the output signal from the piezoelectric oscillating circuit is inputted to an input terminal of the monolithic piezoelectric filter, the output signal from the piezoelectric oscillating circuit is a first output, and the output signal from an output terminal of the monolithic piezoelectric filter is a second output.

3. The oscillator for quadrature modulation according to claim 1 or 2, wherein a reactance element is inserted and connected between the output terminal and a ground of the monolithic piezoelectric filter.

4. The oscillator for quadrature modulation according to claim 3, wherein the reactance element is formed by an electrode pattern on the piezoelectric substrate configuring the monolithic piezoelectric filter or the piezoelectric oscillator.

5. An oscillator for quadrature modulation, comprising:
a monolithic piezoelectric filter; and
an oscillating circuit in which an output terminal of the monolithic piezoelectric filter is a frequency determining element, and at least one of the piezoelectric oscillator and the monolithic piezoelectric filter uses AT cut quartz, and wherein
an output signal from the oscillating circuit is a first output, and an output signal from an output terminal of the monolithic piezoelectric filter is a second output.

6. An oscillator for quadrature modulation comprising:
a piezoelectric oscillating circuit in which a piezoelectric oscillator is a frequency determining element;
a monolithic crystal filter generating a phase difference between an input signal and an output signal; and
electronic parts for configuring the oscillating circuit are mounted on the piezoelectric substrate configuring the monolithic piezoelectric filter or the piezoelectric oscillator, and the output signal from the piezoelectric oscillating circuit is inputted to an input terminal of the monolithic piezoelectric filter, the output signal from the piezoelectric oscillating circuit is a first output, and the output signal from an output terminal of the monolithic piezoelectric filter is a second output.

7. An oscillator for quadrature modulation, comprising:
a monolithic piezoelectric filter; and
an oscillating circuit in which an output terminal of the monolithic piezoelectric filter is a frequency determining element; wherein
electronic parts for configuring the oscillating circuit are mounted on the piezoelectric substrate configuring the monolithic filter or the piezoelectric oscillator, and
an output signal from the oscillating circuit is a first output, and an output signal from the output terminal of the monolithic piezoelectric filter is a second output.

* * * * *

UNITED STATES PATENT AND TRADEMARK OFFICE
CERTIFICATE OF CORRECTION

PATENT NO. : 7,388,445 B2
APPLICATION NO. : 11/068679
DATED : June 17, 2008
INVENTOR(S) : Tsuyoshi Ohshima et al.

It is certified that error appears in the above-identified patent and that said Letters Patent is hereby corrected as shown below:

Title page Item (73) Assignee: Change "Toyo Communication Equipment Co., Ltd., Kanagawa (JP)," to --EPSON TOYOCOM CORPORATION, TOKYO, (JP)--

Signed and Sealed this

Twenty-sixth Day of January, 2010

David J. Kappos
*Director of the United States Patent and Trademark Office*